US010107573B1

(12) United States Patent
Jacob et al.

(10) Patent No.: US 10,107,573 B1
(45) Date of Patent: Oct. 23, 2018

(54) METHODS FOR PROTECTING COOLING PORTS FROM ELECTRO-CORROSION IN STACKED COOLERS AND ARTICLES MADE USING THE METHODS

(71) Applicants: Jonah H. Jacob, Brookline, MA (US); Henry M. Eppich, Andover, MA (US)

(72) Inventors: Jonah H. Jacob, Brookline, MA (US); Henry M. Eppich, Andover, MA (US)

(73) Assignee: SCIENCE RESEARCH LABORATORY, INC., Somerville, MA (US)

( * ) Notice: Subject to any disclaimer, the term of this patent is extended or adjusted under 35 U.S.C. 154(b) by 601 days.

(21) Appl. No.: 14/593,576

(22) Filed: Jan. 9, 2015

Related U.S. Application Data

(60) Provisional application No. 61/925,771, filed on Jan. 10, 2014.

(51) Int. Cl.
*F28F 3/00* (2006.01)
*F28F 19/00* (2006.01)
*F28F 3/08* (2006.01)

(52) U.S. Cl.
CPC .............. *F28F 19/004* (2013.01); *F28F 3/08* (2013.01)

(58) Field of Classification Search
CPC ...... F28F 19/004; F28F 3/08; Y10T 29/49165
See application file for complete search history.

(56) References Cited

U.S. PATENT DOCUMENTS 7,086,839 B2 * 8/2006 Kenny .................... F04B 17/00
204/600

OTHER PUBLICATIONS

Treusch, G. Reliability of Water Cooled High Power Diode Laser Modules, High-Power Diode Laser Technology and Applications III, Proc. of SPIE vol. 5711 (SPIE, Bellingham, WA, 2005).
Instrumentation & Control: Microchannel Coolers (MCC), Fuji Electric, accessed Nov. 15, 2013.

* cited by examiner

*Primary Examiner* — Richard Chang
(74) *Attorney, Agent, or Firm* — Burns & Levinson LLP; Orlando Lopez (57) ABSTRACT

Methods to minimize electro-corrosion in the water cooling ports of stacked heat sinks (coolers) and components fabricated according to those methods are disclosed.

7 Claims, 7 Drawing Sheets

LD cooler: section side view

FIG. 1a

LD cooler:
Section view

Heat extraction region

FIG. 1b

Slots to inlet and outlet
primary manifolds

LD bar    LD cooler: full view

METHODS FOR PROTECTING COOLING PORTS FROM ELECTRO-CORROSION IN STACKED COOLERS AND ARTICLES MADE USING THE METHODS

CROSS REFERENCE TO RELATED APPLICATIONS

This application claims priority to and benefit of U.S. Provisional Application No. 61/925,771, entitled METHODS FOR PROTECTING COOLING PORTS FROM ELECTRO-CORROSION IN STACKED COOLERS AND ARTICLES MADE USING THE METHODS, filed on Jan. 10, 2014, which is incorporated by reference herein in its entirety and for all purposes.

BACKGROUND

These teachings relate to the electronic and thermal arts, and, more particularly, to thermal control of stacked electronics such as, but not limited to, laser diode (LDs) stacks.

A voltage difference between adjacent heat sinks (coolers) is imposed by the laser diodes (LDs) in vertical stacks. Since coolant passages exist between coolers, the differential voltage across the coolant between coolers drives electro-corrosion in the cooling port regions of metallic coolers. It should be noted that this phenomena is not present in single LD bar devices or some horizontal LD bar array configurations as these configurations do not present voltages across cooling water regions.

There is a need to minimize electro-corrosion in the water cooling ports of stacked heat sinks (coolers).

BRIEF SUMMARY

Methods to minimize electro-corrosion in the water cooling ports of stacked heat sinks (coolers) and components fabricated according to those methods are disclosed herein below.

In one or more embodiments, the method for minimizing electro-corrosion in the cooling water ports of stacked metallic coolers includes minimizing (substantially reducing) electric field stress risers in the cooling water ports, and minimizing (substantially reducing) electron flow through the coolant from one cooling port to a nearest adjacent cooling port.

Components fabricated according to those methods are also disclosed.

For a better understanding of the present teachings, together with other and further needs thereof, reference is made to the accompanying drawings and detailed description and its scope will be pointed out in the appended claims.

DETAILED DESCRIPTION

The following detailed description presents the currently contemplated modes of carrying out the invention. The description is not to be taken in a limiting sense, but is made merely for the purpose of illustrating the general principles of the invention, since the scope of the invention is best defined by the appended claims.

As used herein, the singular forms "a," "an," and "the" include the plural reference unless the context clearly dictates otherwise.

Except where otherwise indicated, all numbers expressing quantities of ingredients, reaction conditions, and so forth used in the specification and claims are to be understood as being modified in all instances by the term "about."

An "interior surface" of a cooling liquid port, as used herein, is the surface of the cooling liquid port that will be wetted by the cooling liquid as the cooling liquid flows through the port and is also referred to as a port wall.

"Stress risers," as used here in, refers to high electric field levels.

In one or more embodiments, the method for minimizing electro-corrosion in the cooling water ports of stacked metallic coolers includes minimizing (substantially reducing) high electric field levels (stress risers) in the cooling water ports, and minimizing (substantially reducing) electron flow through the coolant from one cooling port to a nearest adjacent cooling port.

Figure 1A:
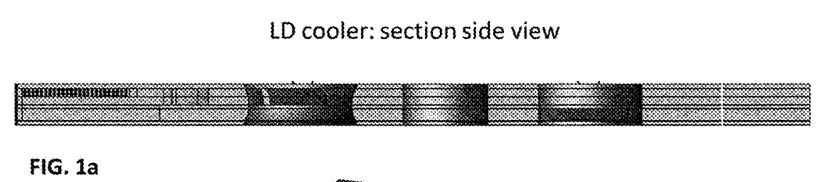
FIGS. 1a-1c show different views of a single LD bar cooler with a LD bar attached.
Figures 1B, 1C:
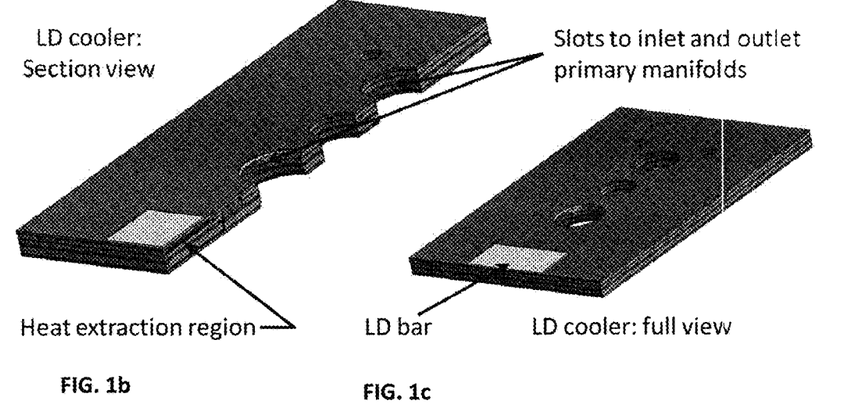
Figure 2:
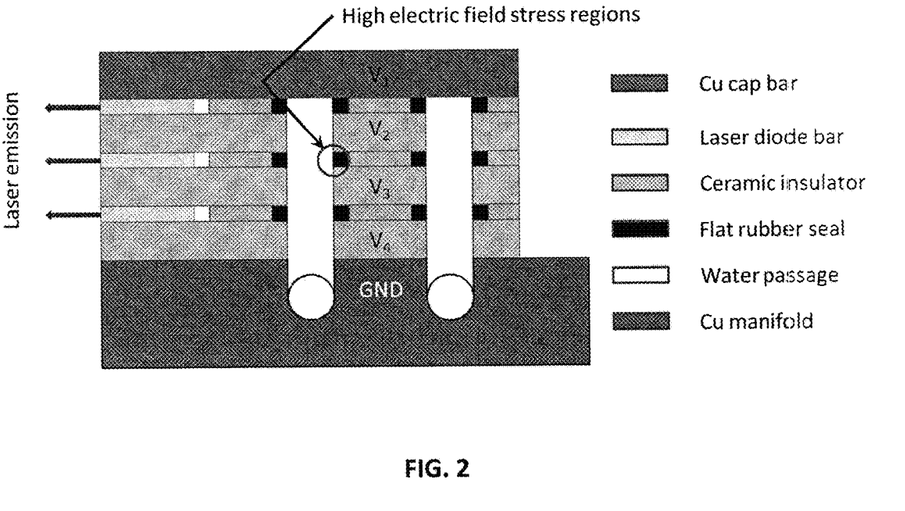
FIG. 2 is a schematic identifying the components making up a vertical three LD bar stack.

FIGS. 1a-1c present a single LD bar cooler unit that may be stacked to produce vertical LD bar arrays. FIG. 2 presents a schematic of a section view of a three LD bar stack, where the section plane for FIG. 2 is the same as given in FIG. 1. As noted above, a voltage difference between each cooler in the stack occurs due to the forward bias voltage generated when a drive current is applied to generate optical emission.

Referring to FIGS. 1a-1c, therein is shown a single LD bar cooler with a LD bar attached. These units may be stacked vertically producing a LD bar array. The inlet cooling port (a) provides coolant through a slot to the heat extraction region. The outlet cooling port (b) provides a passageway for coolant to leave the cooler. Contouring these ports as shown in (a) will reduce electric field stresses that exist in ports that are not contoured (b). Minimizing the electric field stresses at the intersection of the coolant ports and free surfaces of the coolers will minimize electro-corrosion in these areas. Coating the surfaces in and around port regions with an oxide coating will minimize current driven corrosion of the ports. ALD or anodizing could be used to apply oxide coatings for this purpose.

FIG. 2 illustrates regions where high electric field levels (stress risers) exist due to the voltage difference between adjacent coolers in vertical stacks.

Figure 3:
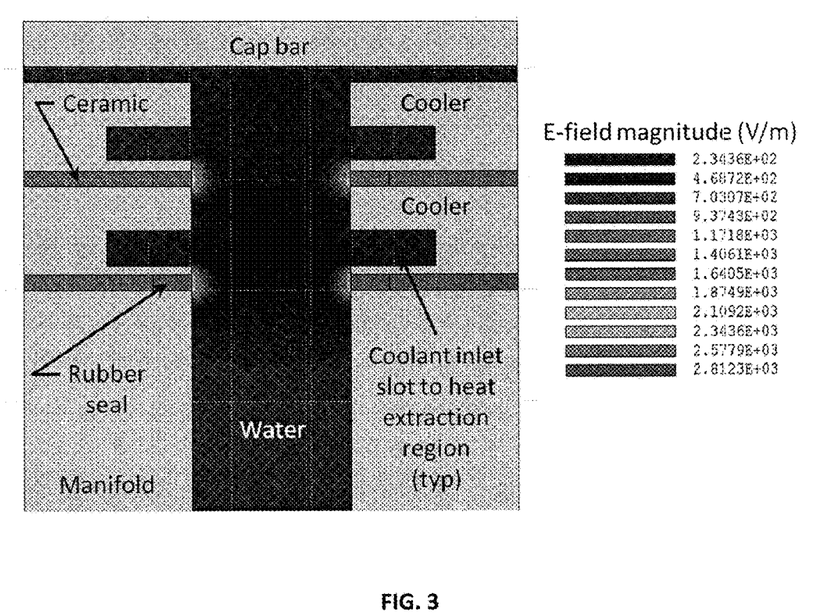
FIG. 3 shows results of electric field finite element computations for the port regions of vertically stack coolers.

FIG. 3 presents electric field contour predictions using the finite element electrostatics solver (Estat) by Field Precision (it should be noted that this is not a limitation of these teachings; other finite element, boundary element or finite difference electrostatics solvers can be used). The solution method models both the dielectric regions (ceramic and rubber seal components, see FIG. 2) and conducting regions (copper coolers, cap bar and manifold, and water). The predictions generating the contours in FIG. 3 are based on: 1) a 1 Volt differential voltage between adjacent coolers, a water conductivity of 3 μS/cm and relative dielectric permittivities of 3 and 10 for the rubber seals and ceramic insulators, respectively. FIG. 3 shows that the regions of high electric field strength are located across the rubber seals, i.e., the initiation and termination of the high electric field stress regions are located just inside the copper coolers on either side of the rubber seals. These regions of electric field stress produce electron flow between adjacent coolers, in the coolant, resulting in electro-corrosion and electrolysis. These initiations sites, where enhanced electro-corrosion has been observed, should be minimized to extend the lifetime of metallic coolers.

Electro-corrosion just inside the cooling water ports of metallic coolers in vertical LD stacks is driven by the electric field stress risers in these regions that arise due to the differential voltage imposed by the LDs and presents an operational problem. Solutions to this problem will allow the use of non-deionized water, e.g., distilled water, thereby removing the needed for deionization beds, monitors/controllers and control valves, etc. This will reduce the size, weight and complexity of the cooling system for laser diode systems or other stacked cooling applications where electro-corrosion is present.

Embodiments of the methods of these teachings for minimizing electro-corrosion in the cooling water ports of metallic coolers when stacked to form vertical LD arrays by minimizing electric field stress risers in these regions and by minimizing electron flow through the coolant from/to its nearest adjacent neighbors are disclosed herein below. It should be noted that other embodiments are also within the scope of these teachings.

Figure 4:
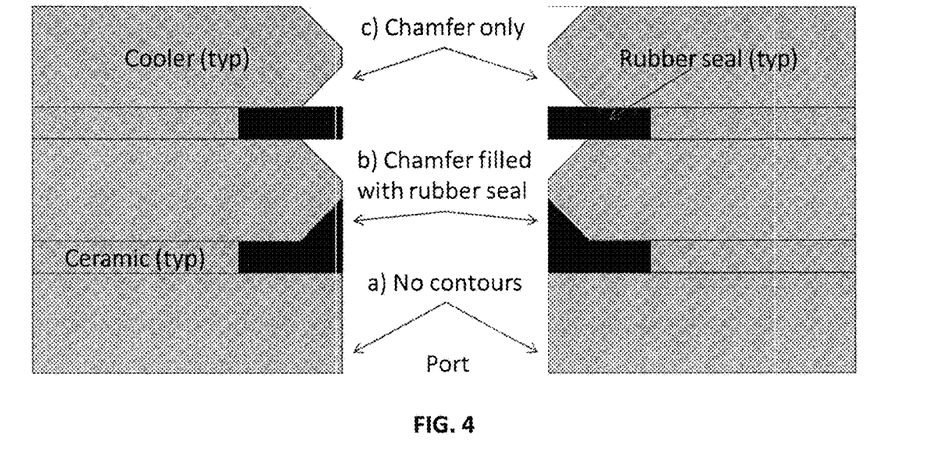
FIG. 4 shows variations on port contouring using chamfering.

Port contouring, as shown in FIG. 1a, recesses the area initiating/terminating the elevated electric field stress risers from the inside diameter edge of the rubber seals (see FIG. 4). This shadows the initiation/termination areas, thereby reducing the magnitude of the electric field stress risers.
   a. Minimizing electric fields between adjacent coolers in a vertical stack will minimize electro-corrosion in the port regions.
   b. The goal of contouring is to break the sharp edges at the port/free-surface interface, thereby shadowing the resulting recessed surface and minimizing the magnitude of the electric field between adjacent coolers.
   c. FIG. 4 presents ways in which chamfering may be used to minimize local electric fields.
   d. The contouring may be achieved by chamfering or machining a specified profile.

Referring to FIG. 4, shown therein are variations on port contouring using chamfering. Other contour profiles may be employed, such as, for example, but not limited to, applying a constant or varying radius profile. The end result of contouring the internal surface of the cooling port will be minimization of electric fields across the rubber seal.

Contouring the slots to the internal primary inlet and outlet manifolds (see FIG. 1) is needed to minimize electric field stress risers on the edges formed by the intersection of these slots with the cylinder forming the ports. This may be achieved using electro-polishing methods.

The slots to the internal inlet and outlet primary manifolds should be relocated to the mid-plane between the two external broad area surfaces of the cooler, which places their intersection with the cylinder forming the ports in the lowest electric field region in the ports (see FIG. 3).

Dielectric oxide (insulating) coatings applied to the internal cylindrical surfaces of the cooling ports, as well as the internal surfaces of the slots in the near vicinity of the cylinder forming the ports, will prevent electron flow in the coolant between adjacent coolers, thereby minimizing electro-corrosion in the port regions. (Near vicinity being determined by factors such as the deposition of coating process.)
   a. Dielectric coatings may be applied using anodizing and atomic layer deposition (ALD) processes. ALD coatings may include, but are not limited to, oxides of aluminum, zirconium, hafnium.
   b. Thin metallizations covering the ALD coated or anodized internal surfaces of the cooling ports may further reduce electro-corrosion. One possible explanation for this phenomenon is that the metals used for the metallizations are inherently resistant to corrosion. It may be that these thin metal coatings may provide an electrically resistive coating that modifies the voltage field in the ports resulting in reduced electric field risers. And it may be a combination of both of these mechanisms. Regardless of the mechanism(s), it has been observed by the inventors that thin metallizations covering the ALD coated or anodized internal surfaces of the cooling ports can further reduce electro-corrosion.

Figure 5A:
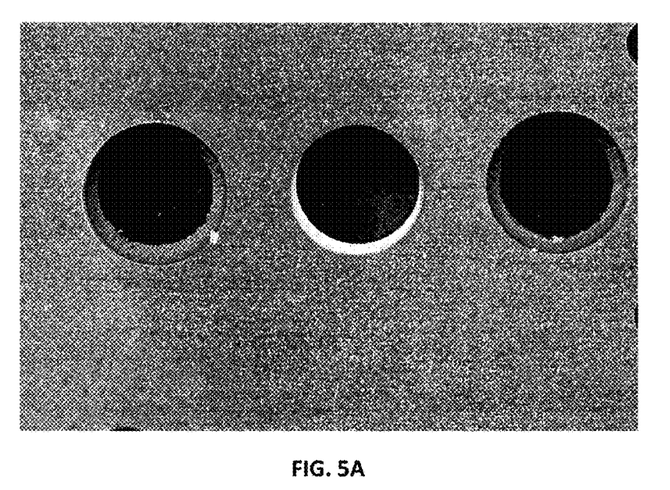
FIG. 5a shows extruded flat seals extending into cooling port passages as used in these teachings.
Figure 5B:
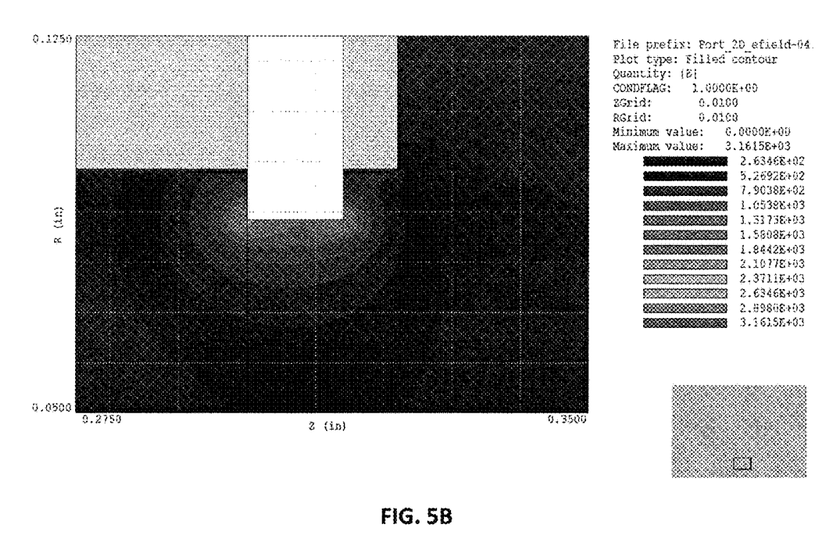
FIG. 5b shows electric field calculations for extruded flat seals extending into cooling port passages as used in these teachings.
Figure 6:
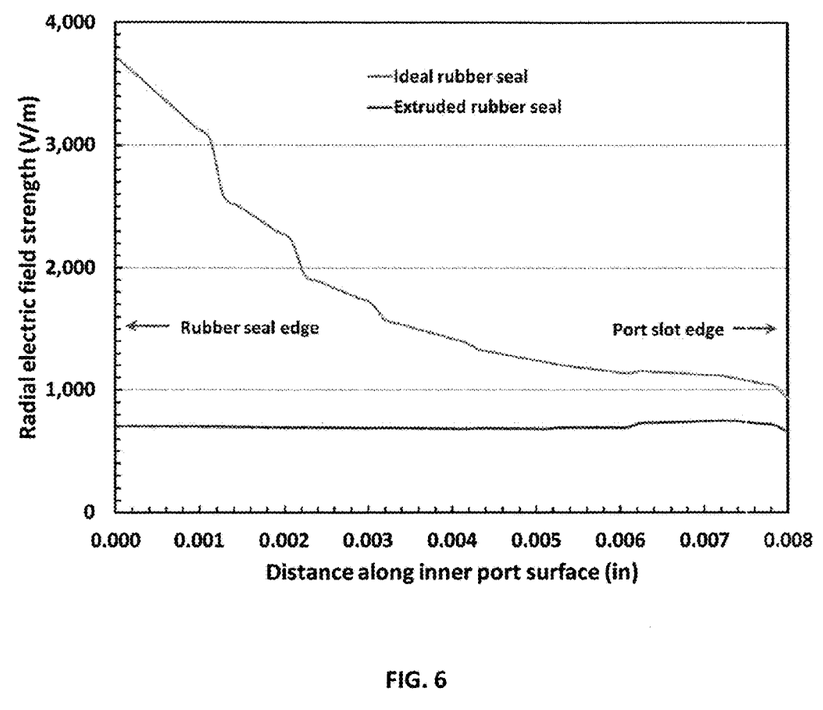
FIG. 6 shows a graphical representation of electric field strength as a function of distance along inner port surface for several configurations.
Figure 7A:
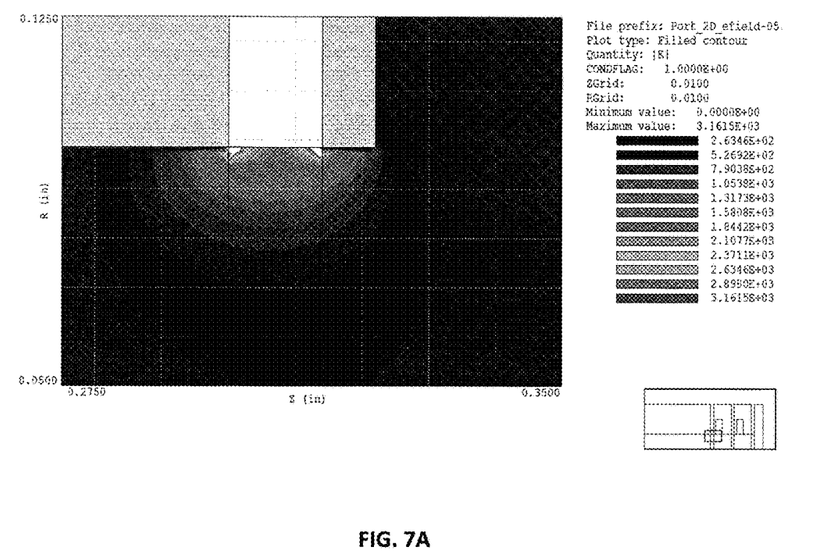
FIGS. 7a, 7b show electric field predictions in the near region of two configurations.
Figure 7B:
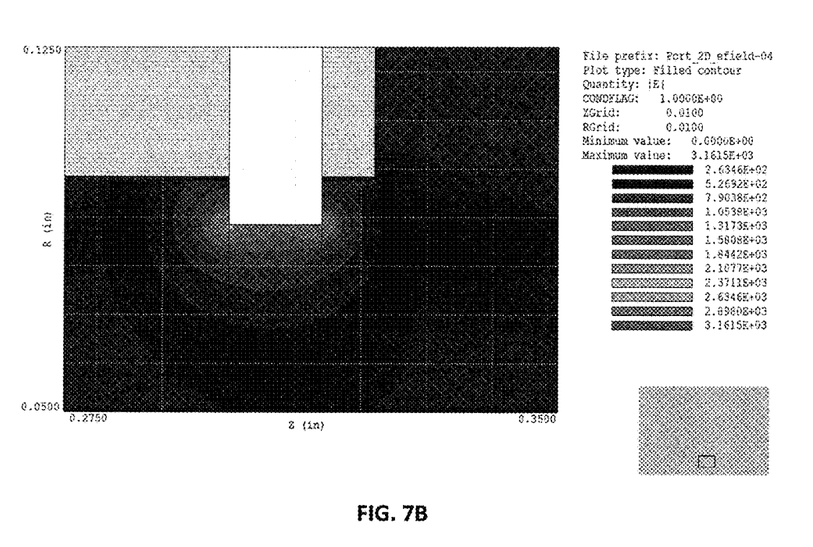

The flat seal can extrude into the port passage in order to minimize the magnitude of the electric field normal to port walls, thereby minimizing electron flow from one cooler to its nearest neighbor (See FIGS. 5-7). This will minimize electro-corrosion of port walls.

Extruded flat seals that extend into port passages could have varied shapes, so intentional, some are dictated by the deformation behavior of the flat seal material.

Referring to FIG. 5b, shown therein are extruded flat seals extending into cooling port passages reducing electric fields on passage walls. Referring to FIG. 5b, shown therein are electric field calculations for extruded flat seals extending into cooling port passages. As can be seen from FIGS. 5a and 5b, extruded flat seals extending into cooling port passages reduce electric fields on passage walls.

As can be seen from FIG. 6, slight protrusion of compressed flat seals into port passages reduces local electric fields by ~5×. The protrusion for the FEA predictions in FIG. 6 and FIG. 5b is 0.010". The protrusion in the image given in FIG. 5a is 0.028", which should lead to drastically reduced local electric field stresses in the physical device.

FIGS. 7a-7b show Electric field predictions in the near region of (a) an ideal flat seal (no extrusion) and of (b) an extruded flat seal that protrudes into the port passage. The extruded seal significantly reduces electric fields along the walls of the port.

Screens covering ports would prevent corrosion inside ports by extending the potential of the external surface of the coolers across the ports. This would shield port passages from significant electric fields. The screens could be two or more wires crossing the ports from one side to the other. Screens should be made of an electro-corrosion resistant material, yet capable of transferring the surface potential of the cooler across the mesh.

For the purposes of describing and defining the present teachings, it is noted that the term "substantially" is utilized herein to represent the inherent degree of uncertainty that may be attributed to any quantitative comparison, value, measurement, or other representation. The term "substantially" is also utilized herein to represent the degree by which a quantitative representation may vary from a stated reference without resulting in a change in the basic function of the subject matter at issue.

Although exemplary embodiments are presented in order to better describe and illustrate these teachings, it should be noted that these teachings are not limited to only those exemplary embodiments. Although these teachings have been described with respect to various embodiments, it should be realized these teachings are also capable of a wide variety of further and other embodiments within the spirit and scope of the appended claims.

The invention claimed is:

1. A method for minimizing electro-corrosion in cooling liquid ports of stacked metallic coolers, the method comprising:
substantially reducing high electric field levels in the cooling liquid ports; and substantial reducing electron flow through coolant from one cooling liquid port to a nearest adjacent cooling liquid port; wherein a nonconductive spacer is disposed between each two stacked coolers, an opening in the nonconductive spacer being one of congruent with or protruding into a cooling liquid port; and wherein substantially reducing high electric field levels in the cooling liquid ports comprises contouring an interior surface of at least some of the cooling liquid ports such that the interior surface of each of the at least some of the cooling liquid ports starts or ends at a location on the nonconductive spacer disposed away from the opening in the nonconductive spacer and recessed away from an original non-contoured location.

2. The method of claim 1 wherein the nonconductive spacer comprises a seal extending from a location interior to said opening to a location of an interior surface the cooling liquid port.

3. The method of claim 1 wherein substantially reducing electron flow through the coolant from one cooling liquid port to a nearest adjacent cooling liquid port comprises applying an insulating coating to an internal surface of each cooling liquid port and to a portion of an internal surface of coolant inlet slots, the portion of the internal surface of the coolant inlet slots being in near vicinity of the internal surface of said each cooling liquid port.

4. The method of claim 3 wherein the insulating coating comprises an oxide of one of aluminum, zirconium or hafnium.

5. The method of claim 3 wherein substantially reducing electron flow through the coolant from one cooling liquid port to a nearest adjacent cooling liquid port further comprises applying a metallization coating to the insulating coating.

6. The method of claim 1 wherein the nonconductive spacer protrudes into the cooling liquid port.

7. The method of claim 1 further comprising disposing one conductive screen over an input to said one cooling liquid port and another conductive screen over an output of said one cooling liquid port.

* * * * *